(12) United States Patent
Horibe

(10) Patent No.: US 6,317,855 B1
(45) Date of Patent: Nov. 13, 2001

(54) METHOD AND APPARATUS FOR CHECKING DATA ERROR CORRECTION

(75) Inventor: Koji Horibe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/162,142

(22) Filed: Sep. 29, 1998

(30) Foreign Application Priority Data

Apr. 14, 1998 (JP) .................................................. 10-102699
Aug. 20, 1998 (JP) .................................................. 10-234230

(51) Int. Cl.[7] ........................... H03M 13/00; G11C 29/00
(52) U.S. Cl. ........................ 714/752; 714/771; 714/804; 714/805
(58) Field of Search ..................................... 714/757, 746, 714/755, 758, 763, 764, 766, 800, 804, 805, 768–773

(56) References Cited

U.S. PATENT DOCUMENTS

| | | | | |
|---|---|---|---|---|
| 5,751,744 | * | 5/1998 | Babb | 714/800 |
| 5,886,654 | * | 3/1999 | Ichikawa et al. | 341/94 |
| 5,966,389 | * | 10/1999 | Kiehl | 714/763 |
| 6,125,466 | * | 9/2000 | Close et al. | 714/758 |

* cited by examiner

Primary Examiner—Emmanuel L. Moise
(74) Attorney, Agent, or Firm—Staas & Halsey LLP

(57) ABSTRACT

Data read from a recording medium, such as a CD or DVD, is checked for errors and the errors are corrected in a fast and efficient manner. First, an error detection code (EDC) is appended to the data, which is arranged in matrix form, by performing a predetermined checking arithmetic operation. Then, a first checking operation is performed on the data using the EDC to generate a first sample value. The data is then error corrected in a first direction and a first correction value is generated if an error is detected. A second checking operation is performed in the first direction using the first correction value to generate a second sample value. The first and second sample values are compared and a first check value is generated. The data is then error corrected in a second direction and a second correction value is generated if an error is detected. A third checking operation is performed in the first direction using the second correction value to generate a third sample value. Finally, the first check value is compared with the third sample value to generate a second check value representative of the check result of the error correction in the second direction.

36 Claims, 14 Drawing Sheets

PI-Interleave

PO-Interleave

Fig.12

PI-Direction →

PO-Direction ↓

|   | $X_1$ | $X_2$ | $X_3$ | $X_4$ | $X_5$ | $X_6$ |
|---|---|---|---|---|---|---|
| $Y_1$ |   |   |   |   |   |   |
| $Y_2$ | • |   |   |   |   | • |
| $Y_3$ |   |   |   |   | • |   |
| $Y_4$ |   |   |   |   |   |   |
| $Y_5$ |   | • |   |   |   |   |
| $Y_6$ | • |   |   | • |   |   |

Fig.13(A)

| error position | correction value |   |
|---|---|---|
| $X_1, Y_2$ | $Z_1$ | ~46a |
| $X_1, Y_6$ | $Z_2$ | ~46b |
| $X_2, Y_5$ | $Z_3$ | ~46c |
| $X_4, Y_6$ | $Z_4$ | ~46d |
| $X_5, Y_3$ | $Z_5$ | ~46e |
| $X_6, Y_2$ | $Z_6$ | ~46f |

Fig.13(B)

| error position | correction value |
|---|---|
| $X_1, Y_2$ | $Z_1$ |
| $X_6, Y_2$ | $Z_6$ |
| $X_5, Y_3$ | $Z_5$ |
| $X_2, Y_5$ | $Z_3$ |
| $X_1, Y_6$ | $Z_2$ |
| $X_4, Y_6$ | $Z_4$ |

METHOD AND APPARATUS FOR CHECKING DATA ERROR CORRECTION

BACKGROUND OF THE INVENTION

The present invention relates to a method and apparatus for checking errors in data. More particularly, the present invention pertains to a method and apparatus for checking data that is read from a recording medium such as a tape, a video tape, a CD and a DVD after error correction has been performed on the data.

FIG. 1 illustrates the format of a sector 1 of data stored in a recording medium, such as a DVD-ROM. The sector 1 includes a twelve byte ID and reserved area, a two kilobyte user data area and a four-byte error detecting code (EDC) area. The EDC area stores an error detecting code (EDC). The EDC is used to confirm whether an error correction of the data has been properly performed, or whether the data has been properly restored, by using an error correcting code (ECC). The EDC includes a cyclic redundancy check (CRC) data obtained by performing a cyclic redundancy check (CRC) arithmetic operation on the user data and the data stored in the ID and reserved area.

Each sector 1 includes twelve data byte groups. The first group includes the twelve byte ID and reserved area and one hundred sixty bytes of user data. The second to eleventh groups each include one hundred seventy two bytes of user data. The last group includes one hundred sixty eight bytes of user data and the EDC area, which is four bytes. FIG. 2 illustrates a data block 2, which includes sixteen sectors 1, a PO-ECC portion 3 and a PI-ECC portion 4. The PO-ECC portion 3 includes ECCs used for performing error correction on each of the sectors 1 along a PO direction (the column or vertical direction as viewed in FIG. 2). The PI-ECC part 4 includes ECCs used for performing error correction on each of the sectors 1 and the PO-ECC portion 3 along a PI direction (the row or horizontal direction as viewed in FIG. 2). Each row of data in the PI-ECC portion 4 and a corresponding row of data in the sectors 1 constitute a PI interleave. A column of data in the PO-ECC portion 3 and corresponding columns of data of the sectors 1 constitute a PO interleave.

FIG. 5 illustrates the format 2a of multiple data blocks 2 recorded on a DVD-ROM. The PO-ECC portion 3 and a part of the PI-ECC portion 4 that corresponds to the portion 3 are divided into sixteen interleaves. Each of the interleaves is inserted after one of the sectors 1. An error correcting circuit in an optical disk reading device performs an error correction on the data blocks 2 as they are read from the DVD-ROM.

More specifically, the error correcting circuit receives a PI interleave a byte at a time along the PI direction as illustrated in FIG. 3. The circuit then generates a PI error syndrome. Next, error information is generated from the one interleave PI error syndrome. The generated information contains the error position and the correction value of any erroneous data. The error correcting circuit corrects the error in the PI interleave using the error position and the correction value. The error correction is repeated for all of the PI interleaves.

The error correcting circuit also receives a PO interleave a byte at a time along the PO direction as illustrated in FIG. 4. The circuit then generates a PO error syndrome. Next, error information is generated from the PO error syndrome. The generated information contains the error position and the correction value of any erroneous data. The error correcting circuit corrects the error in the PO interleave using the error position and the correction value. The error correction is repeated for all of the PO interleaves.

The error correcting circuit further checks whether errors in the user data have been properly corrected, or evaluates the quality of the user data, by performing error detection, or a CRC check, in the PI and PO directions using the EDCs in the sectors 1. In performing the error detection, a CRC arithmetic operation is performed using one sector data of FIG. 1 (the ID and reserved area stored data, user data and the ECC) as base data. If the result of the CRC arithmetic operation is zero, the user data is judged to be free of errors. If there is an error in the user data, a result of the operation shows a value that corresponds to the error.

The error correcting circuit performs the CRC arithmetic operation using the basic data before performing error correction and temporarily stores the CRC operation result. The circuit then performs another CRC arithmetic operation using a correction value generated in the error correction step and compares the result of the first CRC arithmetic operation with the result of the second CRC arithmetic operation. If the results are equal, the error correction using the correction value is judged to be accurate.

In performing error detection for the error corrected data in the PI direction, a CRC arithmetic operation is performed using the basic data on the PI interleave. This CRC arithmetic operation is possible because the input direction of the basic data matches the input direction of data during the PI error correction, and the CRC data is generated in the order in which the basic data is input.

The CRC data is weighted along the PI direction, which prevents error detection from being performed in the PO direction. That is, the data inputting direction for PO error correction is perpendicular to the inputting direction of the basic data in the CRC arithmetic operation. Therefore, the error detection cannot be performed when the PO interleave is being input.

Currently, it is only suggested that error correction and detection (CRC check) are performed again after an error correction in the PO direction. In this manner, error detection for the error corrected data is performed in the Po direction. However, having to perform PI error correction twice increases the time for error detection. Particularly, access time to a buffer memory is increased in a DVD-ROM, in which each data block contains a large amount of data.

Accordingly, it is an objective of the present invention to provide an error checking method and an apparatus that decrease the time required to perform an error check.

SUMMARY OF THE INVENTION

Other aspects and advantages of the invention will become apparent from the following description, taken in conjunction with the accompanying drawings, illustrating by way of example the principles of the invention.

In one aspect of the present invention, a method is provided for error correcting two-dimensionally arranged data and for checking the correction using an error detecting code affixed to the data. The error detecting code was obtained by performing a checking arithmetic operation on the data in a first direction. The method includes steps of performing a first checking arithmetic operation on the data using the error detecting code to generate a first sample value, error correcting the data in the first direction and generating a first correction value if an error is detected, performing a second checking arithmetic operation in the first direction using the first correction value to generate a second sample value, comparing the first sample value with the second sample value to generate a first check value, error correcting the data in a second direction and generating a second correction value if an error is detected, performing a third checking arithmetic operation in the first direction using the second correction value to generate a third sample value, and comparing the first check value with the third sample value to generate a second check value which represents the check result of the error correction along the second direction.

In another aspect of the present invention, a method is provided for error correcting two-dimensionally arranged data and for checking the correction using an error detecting code affixed to the data is provided. The error correcting code is obtained by performing a checking arithmetic operation on the data along a first direction. The method includes steps of performing a first checking arithmetic operation on the data using the error detecting code to generate a first sample value, performing an error correction operation on the data in a second direction and generating a correction value if an error was detected, performing a second checking arithmetic operation along the first direction using the correction value to generate a second sample value, and comparing the first sample value with the second sample value to generate a check value which represents the check result of the error correction in the second direction.

In another aspect of the present invention, a method is provided for checking a result of error correction performed on two-dimensionally arranged data. A column error correcting code for the error correction is affixed to the data in the column direction. An error detecting code, previously obtained by performing a predetermined checking arithmetic operation along the row direction using the data, is affixed to the data. The method includes computing an error position along the column direction and a correction value using the data and the column error correcting code, correcting an error in the data in the column direction using the computed error position and the correction value, and performing the predetermined checking arithmetic operation along the row direction using the correction value along the column direction based on the error position in the row direction to generate a check value.

In yet another aspect of the present invention, a method is provided for checking a result of an error correction operation performed on two-dimensionally arranged data. A row error correcting code is affixed to the data in the row direction. A column error correcting code is affixed to the data in the column direction. An error detecting code is affixed to the data. The error detecting code was previously obtained by performing a predetermined checking arithmetic operation along the row direction using the data. The method includes steps of computing an error position along the row direction and a first correction value of the data using the data and the row error correcting code, correcting an error in the data of the row direction using the computed error position and the first correction value, performing the predetermined checking arithmetic operation using the data and the error detecting code and performing the predetermined checking arithmetic operation using the first correction value to generate a first check value based on the two checking arithmetic operation results, computing an error position along the column direction and a second correction value using the data and the column error correcting code, correcting an error in the data in the column direction using the error position along the column direction and the second correction value, performing the predetermined checking arithmetic operation along the row direction using the second correction value based on the error position along the column direction to obtain an arithmetic operation result, and comparing the arithmetic operation result with the first check value to generate a second check value that represents the result of the error correction in the column direction.

In a further aspect of the present invention an apparatus is provided for error correcting two-dimensionally arranged data and for checking the correction using an error detecting code affixed to the data. The error detecting code was previously obtained by performing a checking arithmetic operation on the basic data along a first direction. The apparatus includes a first checking arithmetic operation circuit for performing a checking arithmetic operation on the data using the error detecting code to generate a first sample value, a first error correcting circuit for error correcting the data along the first direction and for generating a first correction value if there is an error, a second checking arithmetic operation circuit for performing a checking arithmetic operation along the first direction using the first correction value to generate a second sample value, a first comparator for comparing the first sample value with the second sample value to generate a first check value, a second error correcting circuit for error correcting the error-corrected data along a second direction and for generating a second correction value if there is an error, a third checking arithmetic operation circuit for performing a checking arithmetic operation along the first direction using the second correction value to generate a third sample value, and a second comparator for comparing the first check value with the third sample value to generate a second check value, which represents the check result of the error correction along the second direction.

In another aspect of the present invention, an apparatus is provided for error correcting two-dimensionally arranged data and for checking the correction using an error detecting code affixed to the data. The error detecting code was previously obtained by performing a checking arithmetic operation on the data along a first direction. The apparatus includes a first checking arithmetic operation circuit for performing a checking arithmetic operation on the data using the error detecting code to generate a first sample value, an error correcting circuit for error correcting the data along a second direction and for generating a first correction value if an error is detected, a second checking arithmetic operation circuit for performing a checking arithmetic operation along the first direction using the first correction value to generate a second sample value, and a comparator for comparing the first sample value with the second sample value to generate a check value that represents the check result of the error correction along the second direction.

In yet another aspect of the present invention, an apparatus is provided for checking the result of error correction on two-dimensionally arranged data. A column error correcting code for the error correction is affixed to the data in the column direction. An error detecting code, which was previously obtained by performing a predetermined checking arithmetic operation along the row direction of the data, is affixed to the data. The apparatus includes a first circuit for computing an error position in the column direction and a correction value of the data using the data and the column error correcting code and for correcting an error in the data along the column direction using the error position in the column direction and the correction value, and a second circuit for performing the predetermined check arithmetic operation using the correction value based on the error position in the column direction to generate a check value.

In another aspect of the present invention, an apparatus is provided for checking the result of error correction on two-dimensionally arranged data. A row error correcting code for the error correction is affixed to the data in the row direction. A column error correcting code is affixed to the data in the column direction. An error detecting code previously obtained by performing a predetermined checking arithmetic operation along the row direction is affixed to the data. The apparatus includes a row error correcting circuit for correcting an error in the row direction using the data and the row error correcting code. The row error correcting circuit includes a first circuit for computing an error position in the row direction and a first correction value of the data using the data and the row error correcting code, a second circuit for correcting an error in the data in the row direction using the computed error position and the first correction value, a first checking arithmetic operation circuit for performing a checking arithmetic operation using the data and the error detecting code, the checking arithmetic operation using the first correction value along the row direction to generate a first check value. The apparatus further includes a column error correcting circuit for correcting an error in the column direction using the data and the column error correcting code. The column error correcting circuit includes a third circuit for computing an error position in the column direction and a second correction value using the data and the column error correcting code, a fourth circuit for correcting an error in the data in the column direction using the error position in the column direction and the second correction value, a second checking arithmetic operation circuit for performing the predetermined checking arithmetic operation using the second correction value based on the error position along the column direction to generate an arithmetic operation result, and a circuit for comparing the arithmetic operation result with the first check value to generate a second check value that represents the result of the error correction in the column direction.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 12 is a matrix of error positions and correction values;

FIG. 13A is a chart of unsorted error positions and correction values;

FIG. 13B is a chart of sorted error positions and correction values;

DETAILED DESCRIPTION OF THE PREFERRED EMBODIMENTS

The present invention will now be described with reference to the drawings, wherein like numerals are used for like elements throughout.

Figure 1:
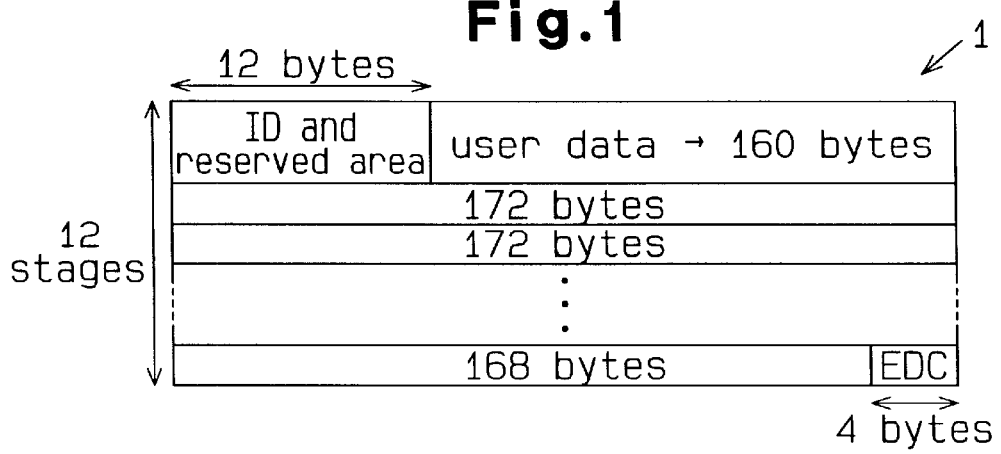
FIG. 1 shows the format of a data sector in a DVD-ROM.
Figure 2:
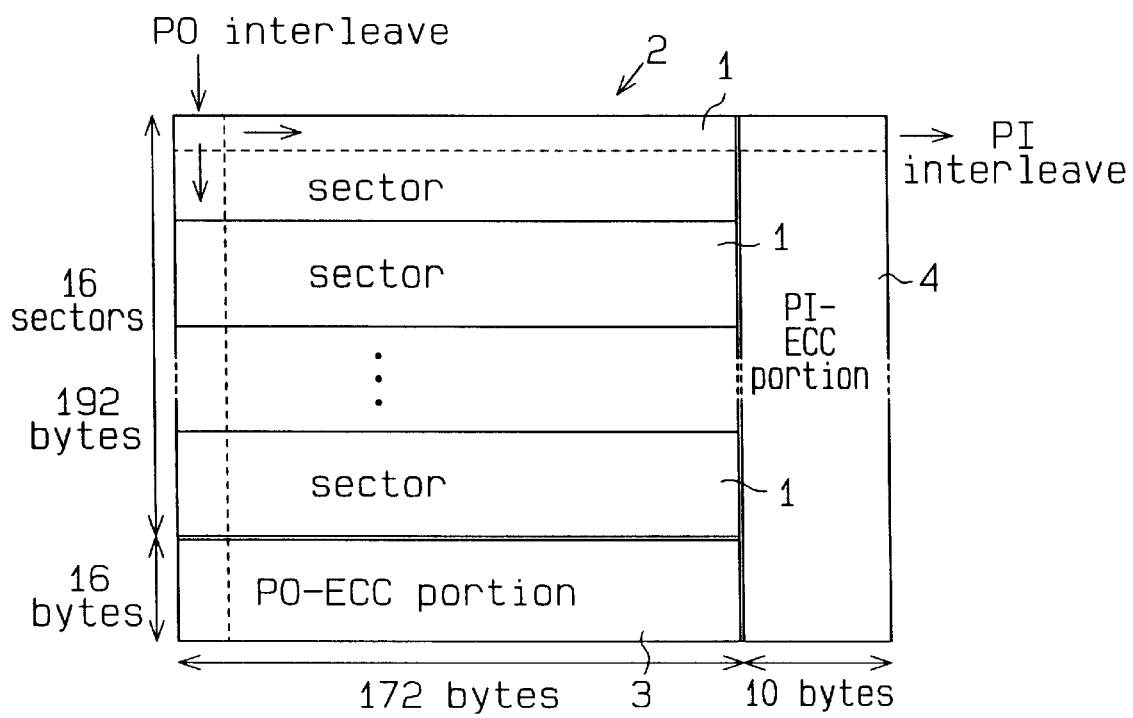
FIG. 2 shows the format of a data block in a DVD-ROM.
Figure 3:
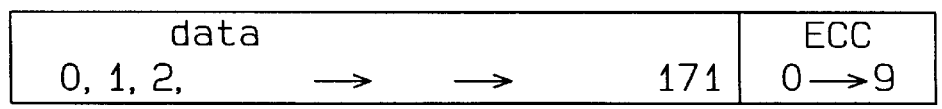
FIG. 3 shows a PI interleave of the data block of FIG. 2.
Figure 4:
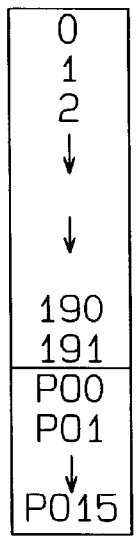
FIG. 4 shows a PO interleave of the data block of FIG. 2.
Figure 5:
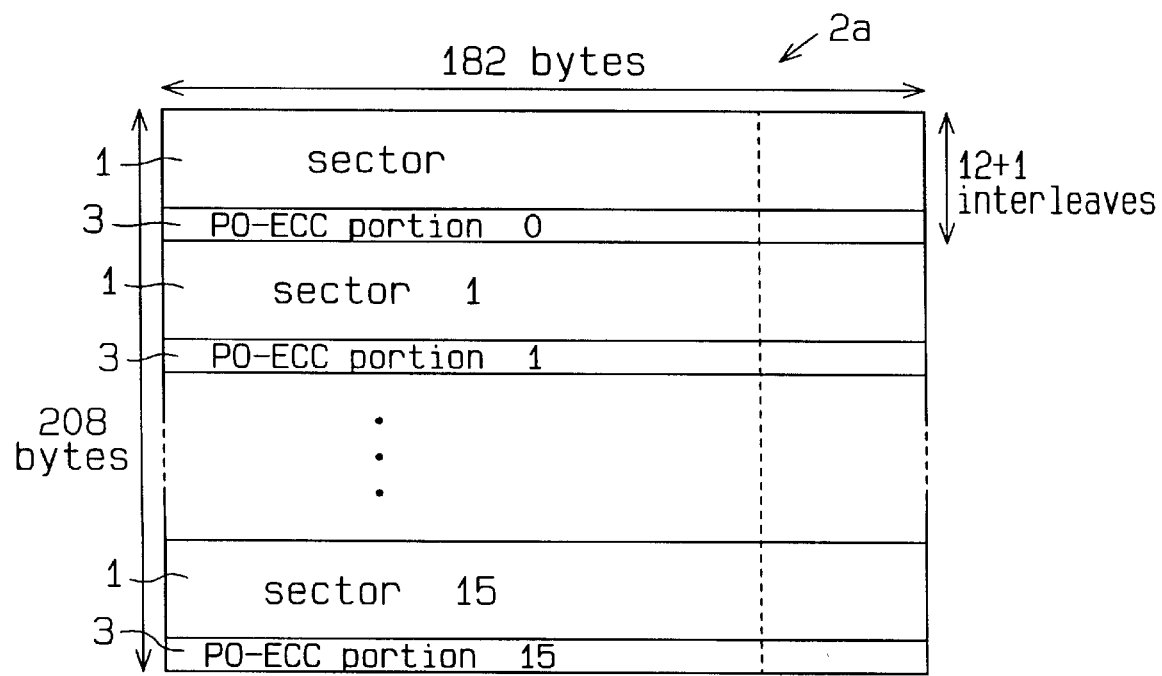
FIG. 5 shows the format of multiple data block in a DVD-ROM.
Figure 6:
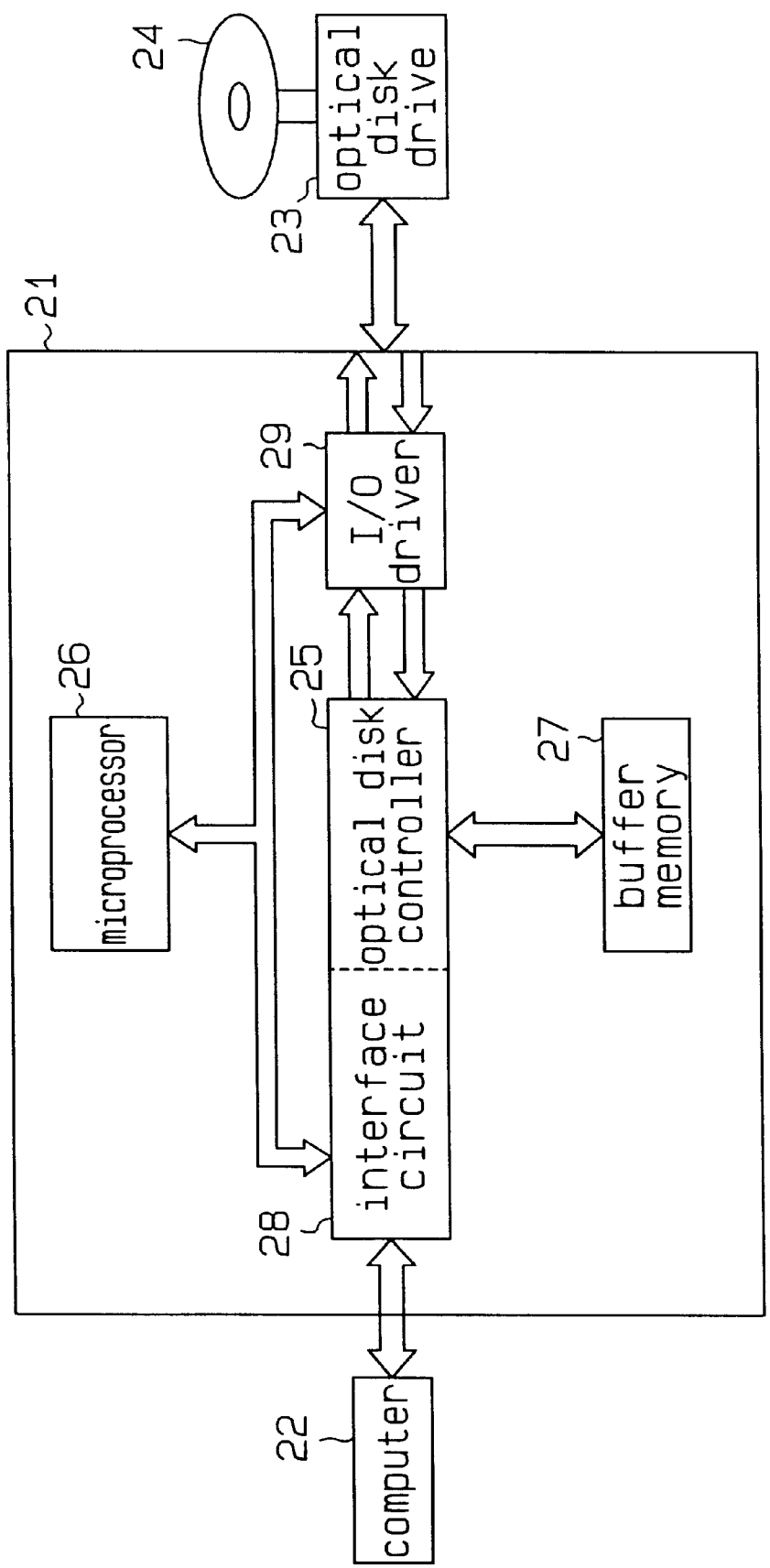
FIG. 6 is a schematic block diagram of an optical disk control unit.

Referring to FIG. 6, a schematic block diagram of an optical disk control unit 21 in accordance with the present invention is shown. The control unit 21 is connected to and communicates with a computer 22 by an interface such as an AT attachment packet interface (ATAPI). The control unit 21 is also connected to an optical disk drive 23 via another interface.

The optical disk drive 23 has an optical pickup (not shown). The disk drive 23 rotates a recording medium 24 such as a digital video disk (DVD) at a predetermined speed and reads data recorded on the DVD 24 with the optical pickup. The optical disk drive 23 then supplies read data to the optical disk control unit 21.

The optical disk control unit 21 includes an optical disk controller 25, a microprocessor 26, a buffer memory 27, an interface circuit 28 and an input/output (I/O) driver 29.

The controller 25 performs the following processes: sending commands to the optical disk drive 23 and receiving a status therefrom, decoding the format of data read from the DVD 24, correcting errors in the read data, transferring data between the optical disk drive 23 and the buffer memory 27, and transferring data between the interface circuit 28 and the buffer memory 27.

The controller 25 receives data from the optical disk drive 23 via the I/O driver 29 and performs error correction and other processes on the data. The controller 25 then stores the error-corrected data in the buffer memory 27. In accordance with a command from the microprocessor 26, the controller 25 transfers the data stored in the memory 27 to the computer 28 via the interface circuit 28.

Figure 7:
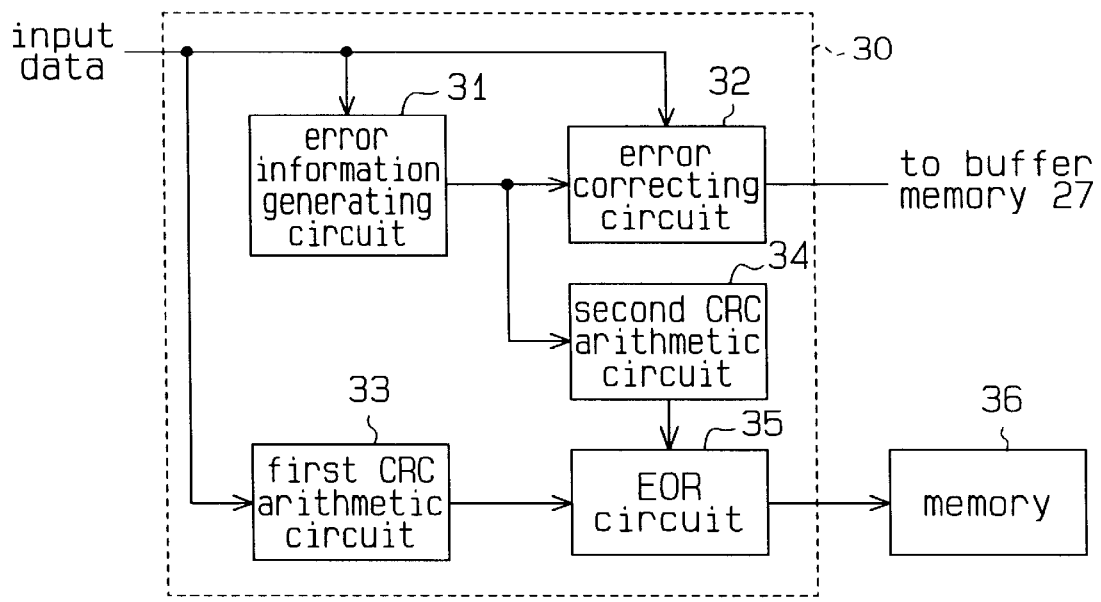
FIG. 7 is a schematic block diagram of a PI error correcting circuit according to a first embodiment of the present invention incorporated in the optical disk controller of FIG. 6.
Figure 8:
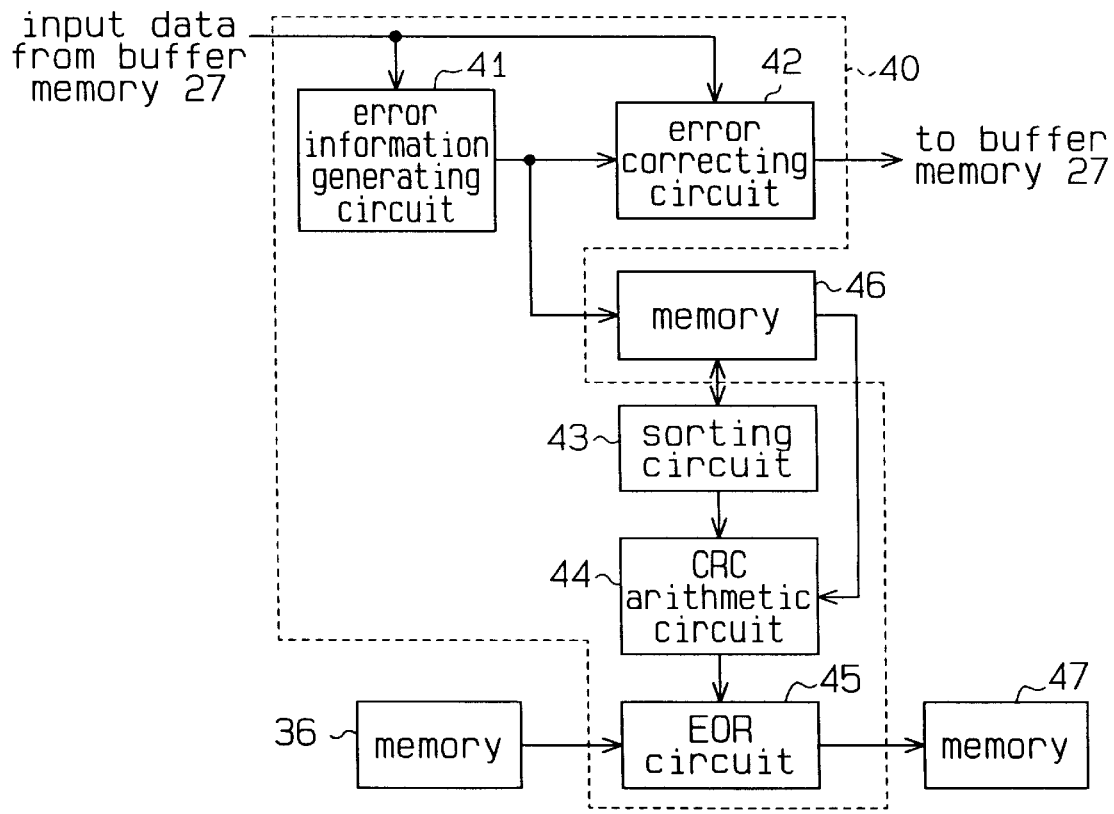
FIG. 8 is a schematic block diagram of a PO error correcting circuit according to the first embodiment of the present invention incorporated in the optical disk controller of FIG. 6.
Figure 9:
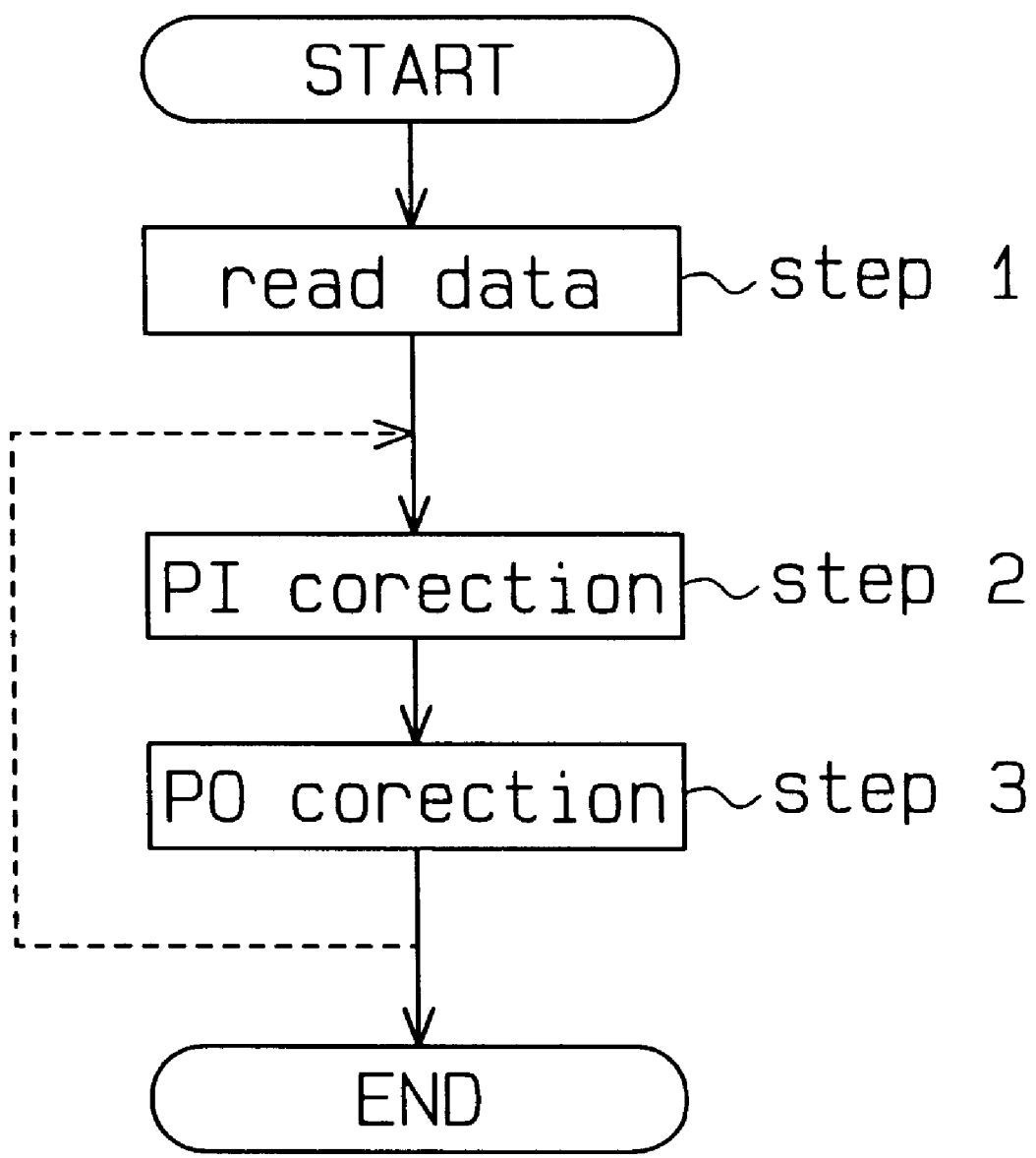
FIG. 9 is a flowchart showing an error correction operation of the optical disk controller of FIG. 6.

The controller 25 includes a PI error correcting circuit 30 shown in FIG. 7 and a PO error correcting circuit 40 shown in FIG. 8.

As shown in FIG. 7, the PI error correcting circuit 30 includes an error information generating circuit 31, an error correcting circuit 32, first and second CRC arithmetic circuits 33, 34 and an exclusive OR circuit 35.

The error information generating circuit 31 sequentially receives input data (PI interleaves) a byte at a time and generates PI syndromes based on the input data. Every time a PI syndrome of PI interleave is generated, the error information generating circuit 31 generates error information using the PI syndrome. The error information includes the position of erroneous data in the PI direction and a correction value for the erroneous data.

The error correcting circuit 32 stores data of a PI interleave into a register (not shown) and corrects errors in the stored data using the error information from the error information generating circuit 31. The error-corrected data is then stored in the buffer memory 27.

The error information generating circuit 31 and the error correcting circuit 32 repeat the aforementioned process for all of the PI interleaves of a data block 2.

The first CRC arithmetic circuit 33 also receives the input data and performs a CRC arithmetic operation on each data sector 1 using the data (the ID and reserved area stored data, the user data and EDC) as the basic data. The CRC arithmetic operation corresponds to an arithmetic operation for computing an EDC, as is known by those of ordinary skill in the art. The first CRC arithmetic circuit 33 performs the CRC arithmetic operation at substantially the same time as the error information generating circuit 31 generates a syndrome and error information. Thus, the time required for performing error correction is shortened compared to prior art devices. The operation result of the first CRC arithmetic circuit 33, or a first sample value, is provided to the EOR circuit 35.

The second CRC arithmetic circuit 34 is connected to the error information generating circuit 31 and performs a CRC arithmetic operation based on the position of an erroneous data using the correction value contained in the error information from the error information generating circuit 31. More specifically, the second CRC arithmetic circuit 34 repetitively performs its CRC arithmetic operation, with the number of repetitions corresponding to the number of bytes of basic data contained in one sector 1. The circuit 34 then sends the result of its CRC arithmetic operation, or a second sample value, to the EOR circuit 35. The CRC arithmetic operation weights the input data in the order in which it is input. Therefore, an accurate result is obtained by performing the CRC arithmetic operation using data the number of bytes that is equal to that of the basic data.

The second CRC arithmetic circuit 34 counts the number of CRC arithmetic operations to match the number of bytes in the CRC operation with the number of bytes of input data. The count value is equal to the number of bytes of user data in a PI interleave. Thus, if the count value does not match the position of the erroneous data, the second CRC arithmetic circuit 34 judges that the basic data is correct and performs a CRC arithmetic operation using a correction value of zero.

The EOR circuit 35 performs an exclusive-OR arithmetic operation on the arithmetic operation results (the first and second sample values) from the first and second CRC arithmetic circuits 33, 34. The EOR circuit 35 then stores the result of the EOR arithmetic operation, or a first determination data, in a memory 36. The memory 36 is preferably a portion of the buffer memory 27. That is, the buffer memory 27 includes a first area for storing an error-corrected data block and a second area for storing the first determination data. The size of the first determination data is smaller than the size of a data block. Thus, the access time of the first determination data to the buffer memory 27 is short. Alternatively, the memory 36 may be independent from the buffer memory 27.

The controller 25 uses the first determination data to determine whether error correction along the PI direction was accurately performed.

As illustrated in FIG. 8, the PO error correcting circuit 40 includes an error information generating circuit 41, an error correcting circuit 42, a sorting circuit 43, a CRC arithmetic circuit 44 and an EOR circuit (comparator) 45.

The error information generating circuit 41 sequentially receives input data (PO interleaves) a byte at a time from the buffer memory 27 and generates PO syndromes based on the input data. Every time a PO syndrome of a PO interleave is generated, the error information generating circuit 41 generates error information using the PO syndrome. The error information includes the position of the erroneous data in the PO direction and a correction value for the erroneous data. The error information is supplied to the error correcting circuit 42 and is also stored in a memory 46.

The error correcting circuit 42 stores data of a PO interleave into a register (not shown) and corrects errors in the stored data based on the error data from the error information generating circuit 41. The error-corrected data is then stored in the buffer memory 27.

The error information generating circuit 41 and the error correcting circuit 42 repeat the aforementioned process for all of the PO interleaves on a data block 2. Error information in the PO direction in a data block is stored in the memory 46.

The error information in the PO direction that is stored in the memory 46 contains the position of the erroneous data. Based on the position of the erroneous data, the sorting circuit 43 sorts the error information into the PI direction and then stores the sorted PI direction error information into the memory 46. The sorting circuit 43 reads the sorted PI direction error information from the memory 46 and sends it to the CRC arithmetic circuit 44.

The error information is stored in the memory 46 only if the input data has errors. Further, since the input data has already been error-corrected in the PI direction, it has has few errors. Thus, the amount of error information to be stored in the memory 46 is significantly smaller than the size of a data block. As a result, the access time to the memory 46 (writing time from the error information generating circuit 41 and the access time to the sorting circuit 43) is shorter than the time required for prior art PI correction, which is performed after the PO error correction.

The CRC arithmetic circuit 44 performs a CRC arithmetic operation based on the erroneous data using a correction value contained in the error information that has been sorted into the PI direction by the sorting circuit 43. Therefore, when performing error correction in the P0 direction, the CRC arithmetic circuit 44 performs CRC arithmetic operation using a correction value along the PI direction, which is the same as the order of data input. Specifically, the CRC arithmetic circuit 44 repetitively performs the CRC arithmetic operation, with the number of repetitions corresponding to the number of bytes in the basic data contained in one sector. The circuit 44 then sends the results of the CRC arithmetic operation, or a third sample value, to the EOR circuit 45. In the CRC arithmetic operation, data is weighted by the order of input. Therefore, an accurate result is obtained by performing CRC arithmetic operation using data having the number of bytes which is equal to that of the basic data. The CRC arithmetic circuit 44 counts the number of CRC arithmetic operation in order to match the number of bytes in the CRC operation with the number of bytes of input data. Thus, the count value is equal to the number of input bytes of data in a PO interleave. If the count value does not match the position of erroneous data, the CRC arithmetic circuit 44 determines that the basic data is correct and performs a CRC arithmetic operation using a correction value of zero.

The EOR circuit 45 receives the first determination data stored in the memory 36 and the result of the arithmetic operation (the third sample value) from the CRC arithmetic circuit 44 and performs an exclusive OR (EOR) operation on the first determination data and the result of the CRC arithmetic operation. The result of the EOR operation is stored into a memory 47 as a second determination data. The first determination data stored in the memory 36 represents the CRC arithmetic operation result of the basic data that have been corrected by the PI error correcting circuit 30. The controller 25 determines whether the PO error correction was accurately performed based on the second determination data stored in the memory 47. In this manner, the CRC check is performed in the PO direction using the first determination data, which represents the result of the CRC check on the PI direction error correction. Therefore, the PO error correcting circuit 40 does not need to have an arithmetic circuit that corresponds to the first CRC arithmetic circuit in the PI error correcting circuit 30. As a result, the circuit area of the PO error correcting circuit 40 is reduced.

In this embodiment, the memories 46, 47 are preferably defined in a portion of the buffer memory 27. The buffer memory 27 thus includes a first area for storing a data block that has been error-corrected by the error correcting circuit 42, a second area (the memories 36, 47) for storing the first and second determination data and a third area (the memory 46) for storing error information. The amount of the first and second determination data and the amount of error information are significantly smaller than the amount of data in a data block. Therefore, the access time to the buffer memory 27 is short. Alternatively, the memories 36, 46 and 47 may be independent from the buffer memory 27.

The error correction of the present invention will now be described with reference to FIGS. 9 to 13B.

In step 1, the controller 25 reads data from the DVD 24. In a subsequent step 2, the controller 25 performs PI error correction in the PI direction on the read data. The controller 25 then performs a CRC check on the PI error corrected data.

Figure 19:
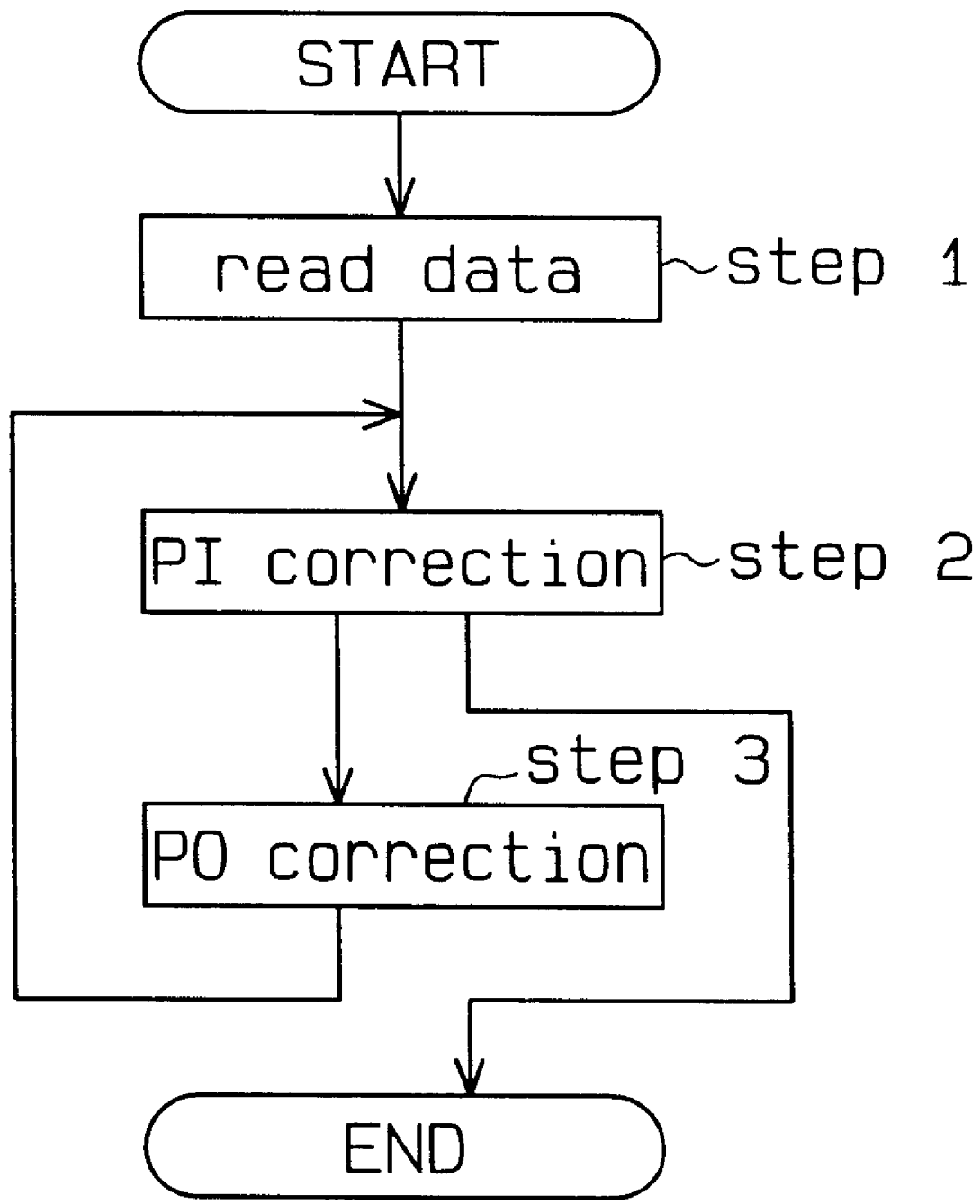
FIG. 19 is a flowchart showing another error correction operation of an optical disk controller in accordance with the present invention.

In step 3, the controller 25 performs PO error correction in the PO direction on the PI corrected data and then performs a CRC check on the PO error corrected data. Based on the result of the CRC check, the controller 25 repeats steps 2 and 3 until there are no errors. Alternatively, as shown in FIG. 19, the error correction operation may be terminated when it is determined that there are no errors based on the result of the CRC check at step 2.

Figure 10:
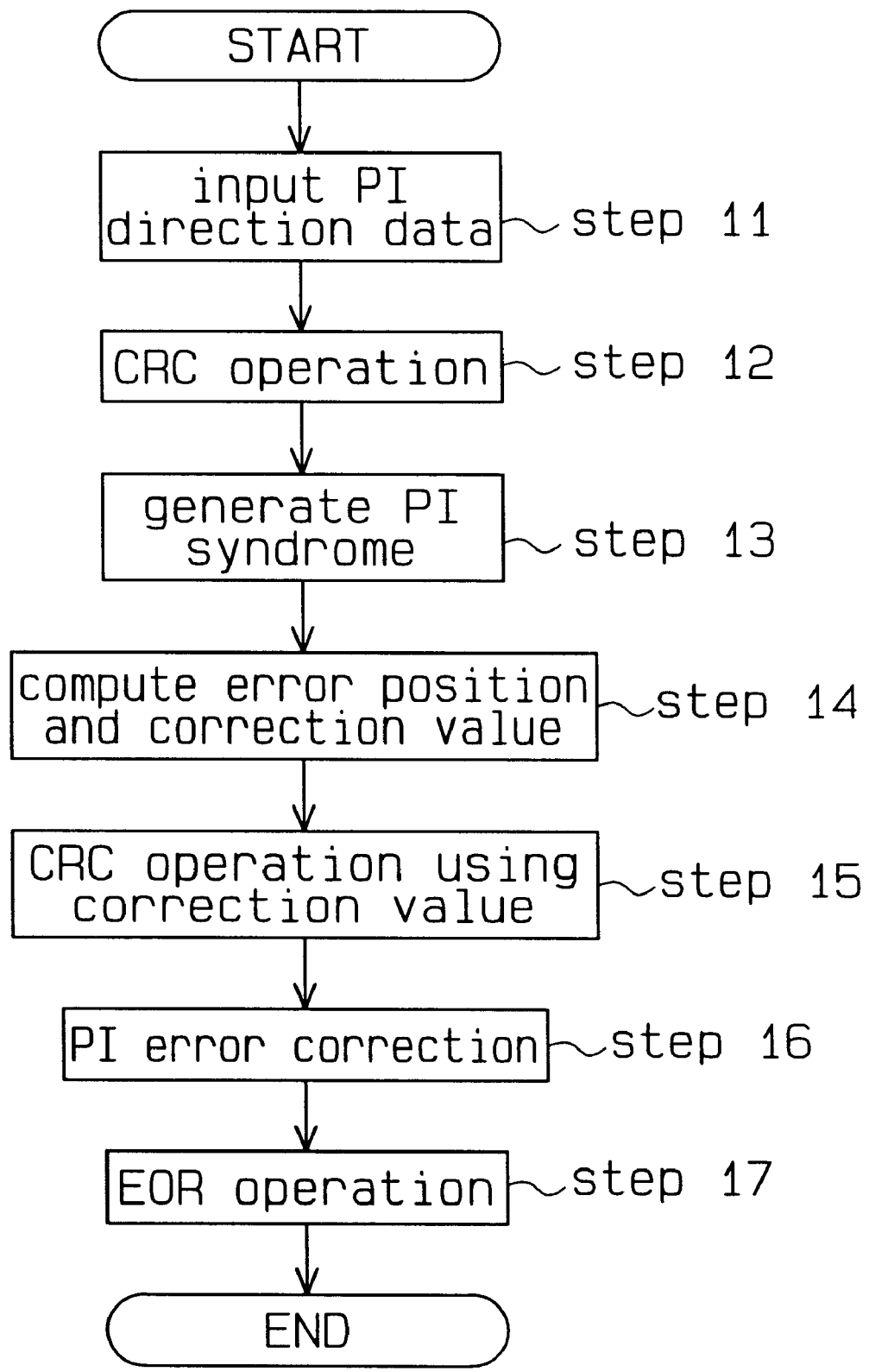
FIG. 10 is a flowchart showing a routine performed by the PI error correcting circuit of FIG. 7.

FIG. 10 is a flowchart showing substeps 11–17 of the PI error correction (step 2). In step 11, the controller 25 sequentially inputs interleaves in the PI direction in each sector 1 of a data block 2 a byte at a time. Next, in step 12, the controller 25 performs the CRC arithmetic operation using basic data. Substantially simultaneously, the controller 25 sequentially generates PI syndromes by a unit of a PI interleave at step 13.

At step 14, the controller 25 computes error information (the position of erroneous data and a correction value) of the PI interleave from the PI syndrome. At step 15, the controller 25 performs the CRC arithmetic operation using the error information.

At step 16, the controller 25 performs error correction on the interleave, or rewrites the erroneous data with correct data, based on the error information. The controller 25 then stores the corrected interleave into the buffer memory 27. When the PI error correction for all of the PI interleaves, or a data block 2, is completed and all of the corrected PI interleaves are stored in the buffer memory 27, the controller 25 moves to step 17. The buffer memory 27 is also used to store the result of CRC arithmetic operation that is performed by using all of the correction values in a data block 2.

At step 17, the controller 25 performs the EOR operation on the result of the CRC arithmetic operation that was obtained using the basic data (step 12) and the result of the CRC arithmetic operation that was obtained using the correction value (step 15). The controller 25 stores the result of the EOR operation in the memory 36. Accordingly, the PI error correction is completed. The controller 25 then performs PO error correction.

Figure 11:
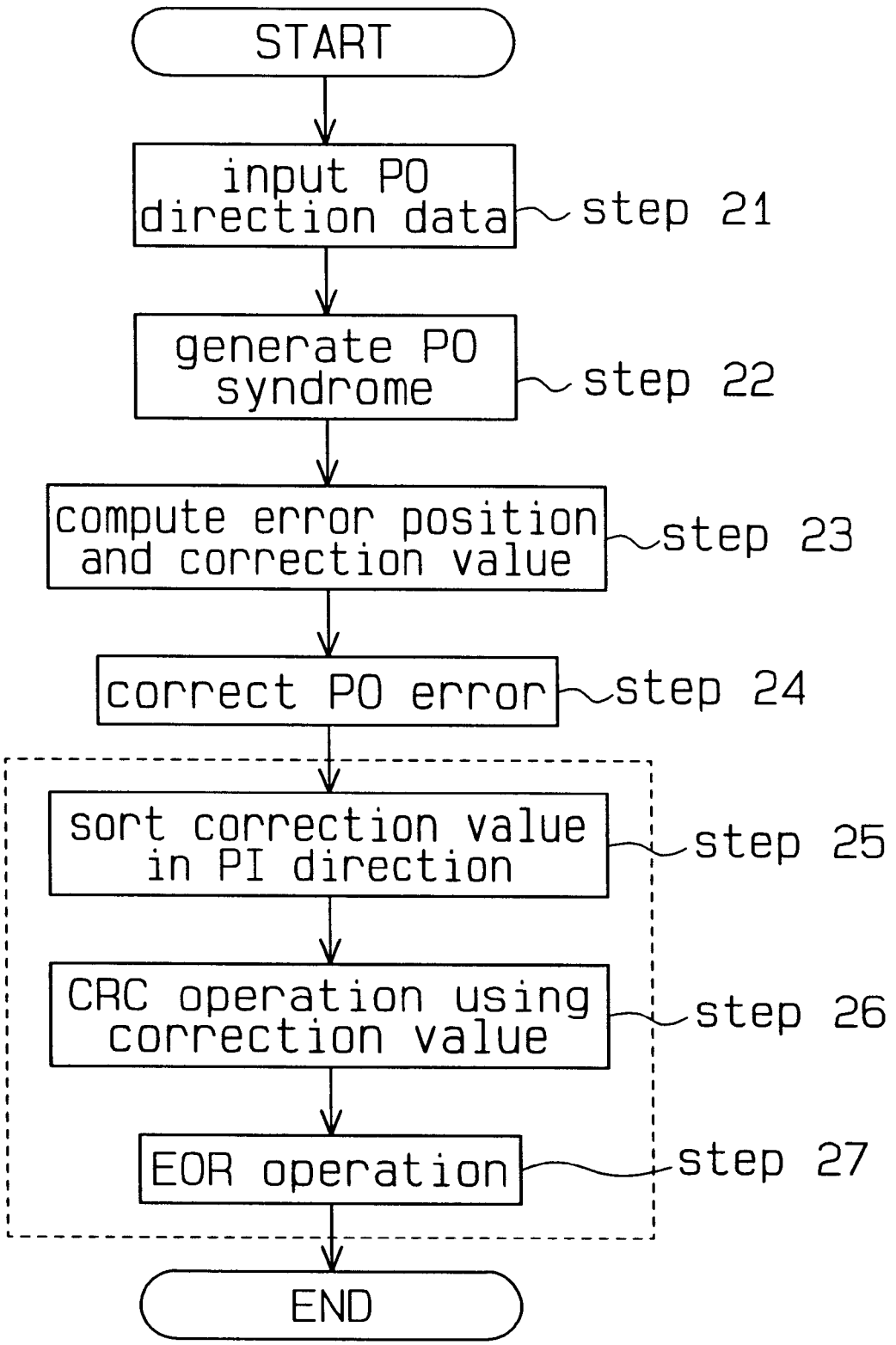
FIG. 11 is a flowchart showing a routine performed by the PO error correcting circuit of FIG. 8.

FIG. 11 is a flowchart showing substeps 21–27 of the PO error correction (step 3). In step 21, the controller 25 sequentially inputs interleaves in the PO direction in each sector 1 of a data block 2 a byte at a time. Next, in step 22, the controller 25 sequentially generates PO syndromes by a unit of a PO interleave at step 22.

At step 23, the controller 25 computes error information (the position of erroneous data and a correction value) of the PO interleave using the PO syndrome and stores the computed error information into the memory 46. At step 24, the controller 25 performs error correction on the PO interleave based on the computed error information and stores the error-corrected PO interleave into the buffer memory 27. PO correction for a data block 2 stored in the buffer memory 27 is completed when PO error correction is repeated for all of the PO interleaves. At this time, the memory 46 stores the computed error information in the PO direction for the entire data block 2.

At step 25, the controller 25 reads the PO-direction error information stored in the memory 46 and sorts the PO-direction error information into PI direction error information based on the position of erroneous data. The sorting will now be described. FIG. 12 illustrates the data block 2, in which the data are arranged in a matrix, for example, of six rows and six columns. In FIG. 12, the error positions computed at step 23 are represented by dots "$^{108}$". As shown in FIG. 13A, the controller 25 stores the error positions and corresponding correction values in the memory 46 along the PO direction. The controller 25 corrects the errors along the PO direction in the column of a coordinate value X1. In this case, the controller 25 computes correction values Z1 and Z2, which correspond to error positions (X1, Y2) and (X1, Y6), respectively. The controller 25 then stores the error position (X1, Y2) and the correction value Z1 in a first area 46a of the memory 46 and stores the error position (X1, Y6) and the correction value Z2 in a second area 46b of the memory 46.

The controller 25 executes PO error corrections to the columns corresponding to the coordinate values X2 to X6 and stores error positions (X2, Y5), (X4, Y6), (X5, Y3), (X6, Y2) and correction values Z3, Z4, Z5, Z6 in areas 46c, 46d, 46e, 46f in the memory 46.

The controller 25 then performs the sorting of step 25. The controller 25 performs a sorting along the PI direction based on rows corresponding to coordinate values Y (Y1–Y6). FIG. 13B shows the result of the sorting step. In this manner, the controller 25 sorts the error information (error positions and correction values) into the PI direction. When finishing the sorting of the error information in all of the PO directions, the controller 25 moves to step 26.

At step 26, the controller 25 performs a CRC arithmetic operation using a correction value contained in the error information, which is sorted into the PI direction. At this time, the controller 25 performs the CRC arithmetic operation using the correction value along the input direction of the basic data (the PI direction).

At step 27, the controller 25 performs the EOR operation on the CRC arithmetic operation result stored in the memory 36 that represents the result of CRC check in the PI error correction and the CRC arithmetic operation result performed using the correction value. In this manner, the controller 25 obtains the result of the CRC check in the PO error correction. Therefore, the controller 25 does not need to perform PI error correction for the CRC check in the PO error correction. As a result, the time required for error correction is decreased.

Figure 14:
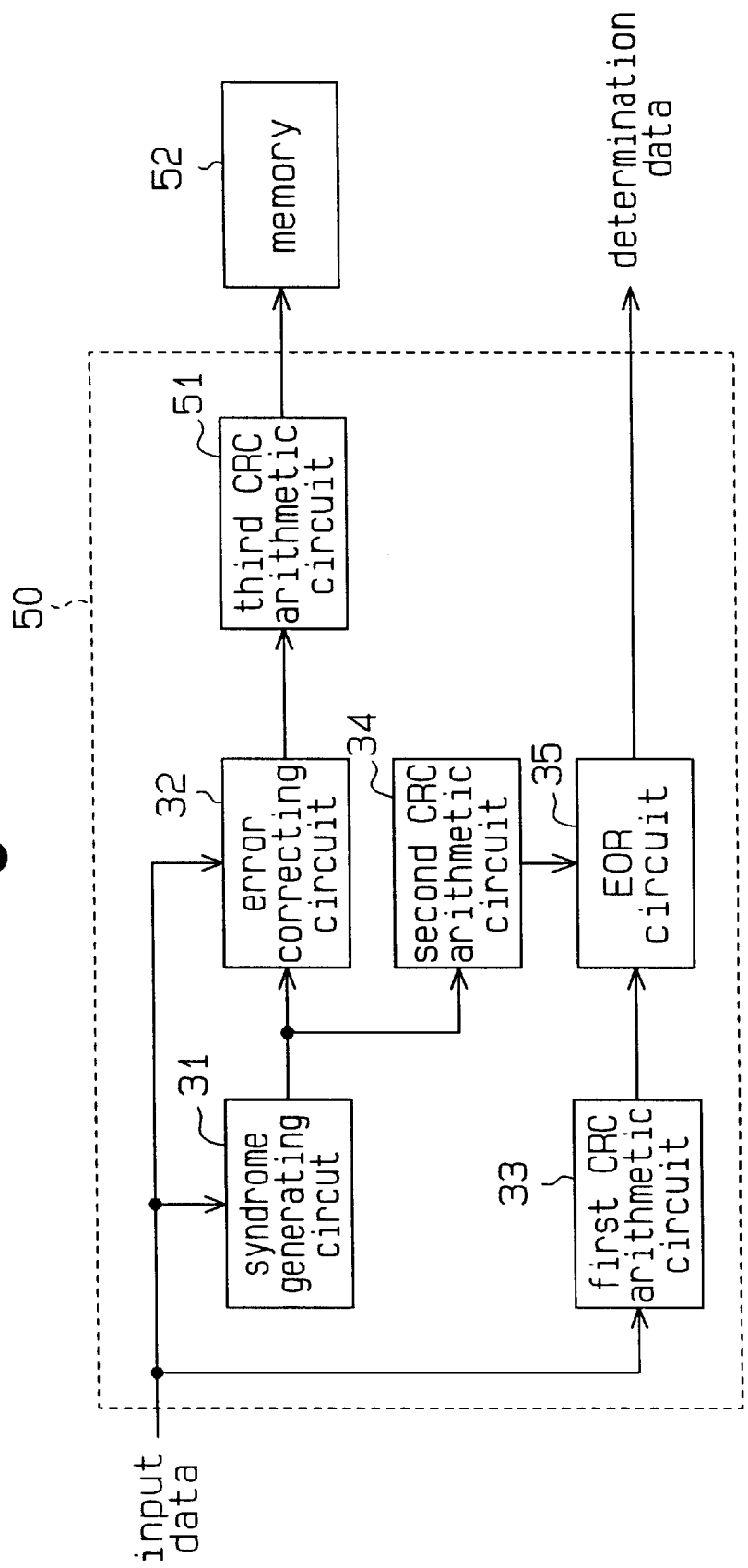
FIG. 14 is a schematic block diagram of a PI error correcting circuit according to a second embodiment of the present invention.

Referring now to FIG. 14, according to a second embodiment of the present invention the controller 25 includes a PI error correcting circuit 50 and the PO error correcting circuit of FIG. 8. The PI error correcting circuit 50 includes an error information generating circuit 31, an error correcting circuit 32, first to third CRC arithmetic circuits 33, 34, 51 and an EOR circuit 35. The same reference numerals are given to those components that are the same as the corresponding components of the PI error correcting circuit 30 of FIG. 7. The third arithmetic circuit 51 performs a CRC arithmetic operation using user data and the error detection code (EDC) that have been error-corrected by the error correcting circuit 32. The circuit 51 then stores the result of its CRC arithmetic operation as first determination data into a memory 52. The PI error correcting circuit 50 allows the PO error correcting circuit 40 to check PO error correction based on the result of the CRC arithmetic operation in which error-corrected data is used and the result of the CRC arithmetic operation in which a correction value is used.

Specifically, the error correcting circuit 32 sends the data of an error-corrected interleave to the third CRC arithmetic circuit 51. The third CRC arithmetic circuit 51 performs its CRC arithmetic operation using the error-corrected basic data. In the second embodiment, the memory 52 is preferably defined in a portion or area of the buffer memory 27. That is, the buffer memory 27 includes a first area for storing a data block that is error-corrected by the error correcting circuit 42 and a second area (the memory 52) for storing the result of the CRC arithmetic operation performed by the third CRC arithmetic circuit 51. The amount of data of the CRC arithmetic operation result is significantly smaller than the amount of data of a data block. Therefore, the access time to the buffer memory 27 is short.

The error information generating circuit 31 and the error correcting circuit 32 repeat the aforementioned process for all of the PI interleaves of a data block. The third CRC arithmetic circuit 51 operates parallel with the error information generating circuit 31 and the error correcting circuit 32 and repeats the CRC arithmetic operation for all of the PI interleaves. The third CRC arithmetic circuit 51 substantially simultaneously performs error correction in the PI direction and CRC arithmetic operation. Thus, the CRC arithmetic operation does not increase the time required for the PI error correction.

The EOR circuit 45 in the PO error correcting circuit 40 receives the result of the CRC arithmetic operation stored in the memory 52 and the result of the CRC arithmetic from the CRC arithmetic circuit 44 and performs the EOR operation on these results. The result of the EOR operation is stored in the memory 47 as second determination data. The controller 25 determines whether the PO error correction has been accurately performed based on the second determination data.

Figure 15:
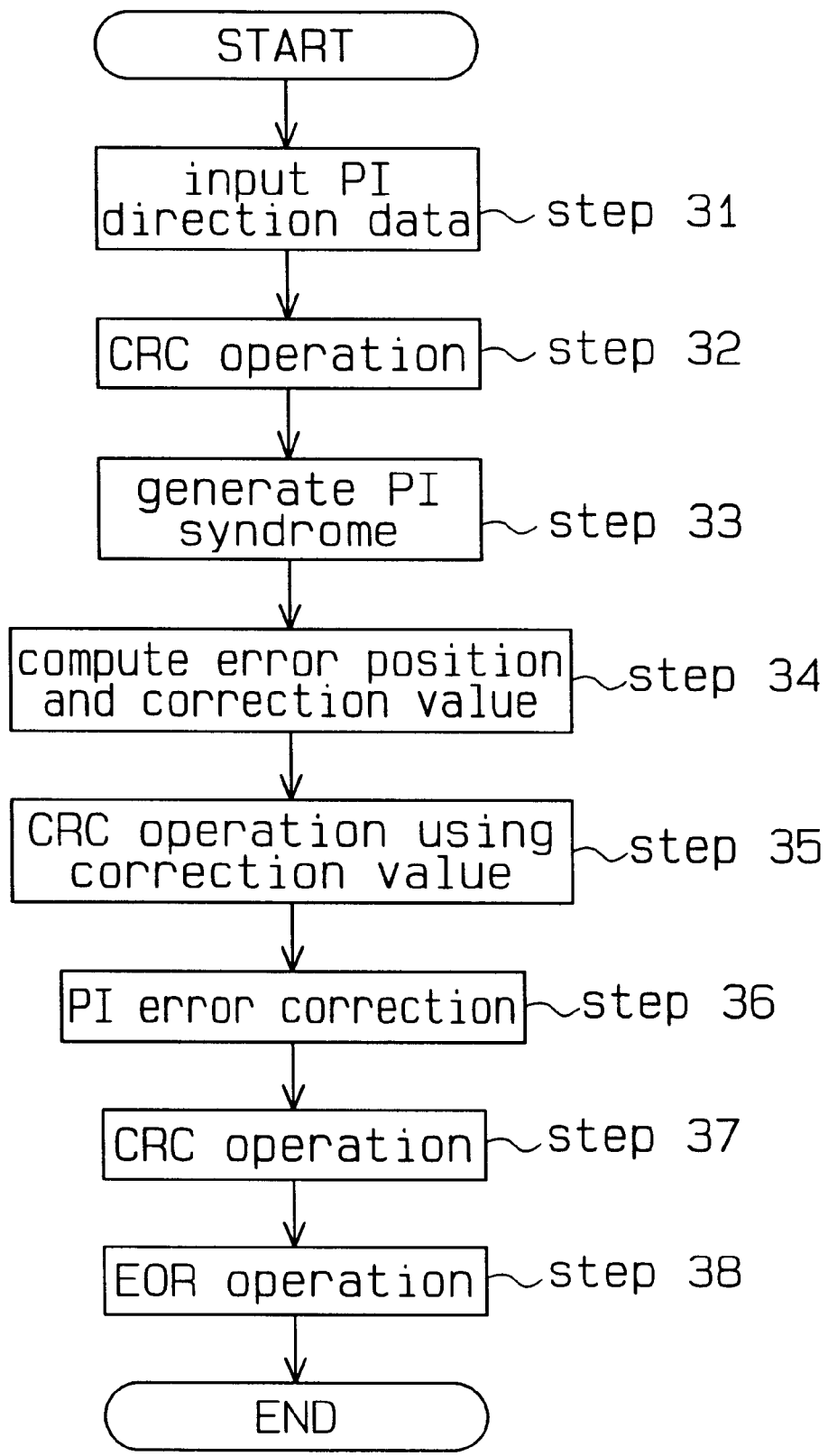
FIG. 15 is a flowchart showing a routine performed by the PI error correcting circuit of FIG. 14.

FIG. 15 is a flowchart showing substeps 31–38 of the PI error correction (step 2). At step 31, the controller 25 sequentially inputs the PI interleaves of each sector 1 in the data block 2 a byte at a time. Next, at step 32, the controller 25 performs a CRC arithmetic operation using the basic data. Substantially simultaneously, the controller 25 performs step 33, which sequentially generates PI syndromes by a unit of a PI interleave.

At step 34, the controller 25 computes error information (the position of erroneous data and a correction value) of a PI interleave based on the PI syndrome. At step 35, the controller 25 performs a CRC arithmetic operation using the computed error information.

At step 36, the controller 25 corrects errors in the PI interleave based on the error information and stores the error-corrected interleave in the buffer memory 27. At the subsequent step 37, the controller 25 performs another CRC arithmetic operation using the basic data in the error-corrected PI interleave. The result of the CRC arithmetic operation is stored in the memory 52. When PI error correction for all of the PI interleaves is completed and the corrected PI interleaves (corresponding to a data block 2) are stored in the buffer memory 27, the controller 25 proceeds to step 38. The buffer memory 27 stores the result of the CRC arithmetic operation in which all of the correction values in a data block 2 are used.

At step 38, the controller 25 performs EOR operation of the result of CRC arithmetic operation (step 32) in which basic data are used and the result of CRC arithmetic operation (step 35) in which a correction value is used. The result of the EOR operation is stored in the memory 36, and PI error correction is completed. Thereafter PO error correction is performed.

According to the present embodiment, at step 27 of the PO error correction, the controller 25 performs an EOR operation on the result of the CRC arithmetic operation (step 17) stored in the memory 52 and the result of the CRC arithmetic operation (step 26) in which a correction value is used. In this manner, the controller 25 obtains the result of the CRC check for PO error correction. The result of the CRC check (step 37) represents the result of the CRC arithmetic operation in which the basic data is used in the PI error-corrected data block. Since the CRC check in PO error correction (step 26) is performed using the result of the CRC arithmetic operation (step 37), PI error correction does not need to be performed for a second time PO error correction. As a result, the total time for performing error correction is shortened.

Figure 16:
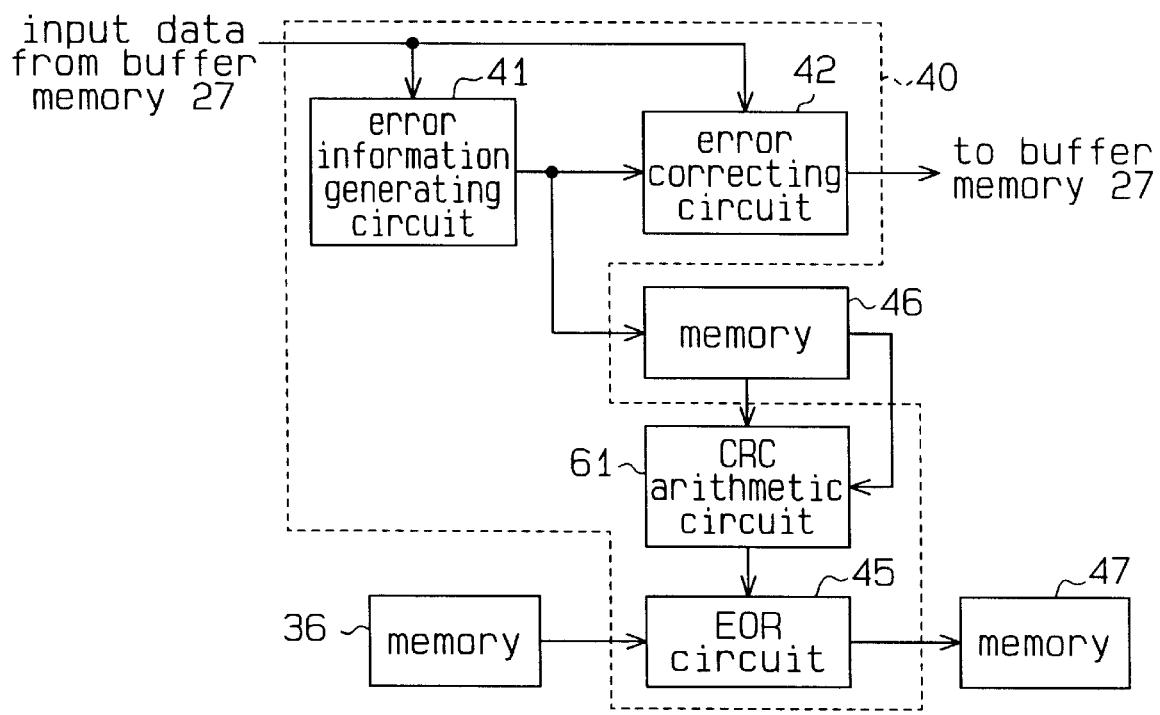
FIG. 16 is a schematic block diagram of a PO error correcting circuit according to a third embodiment of the present invention.

A controller according to a third embodiment of the present invention includes the PI error correcting circuit 30 of FIG. 7 and a PO error correcting circuit 60, as shown in FIG. 16. The PO error correcting circuit 60 includes an error information generating circuit 41, an error correcting circuit 42, a CRC arithmetic circuit 61 and an EOR circuit (comparator) 45.

The error information generating circuit 41 sequentially receives input data (PO interleaves) a byte at a time and generates PO syndromes based on the input data. Every time a PO syndrome of an interleave is generated, the error information generating circuit 41 generates error information using the PO syndrome. The error information includes the position of erroneous data in the PO direction and a correction value for the erroneous data. The error information is supplied to the error correcting circuit 42 and is stored in the memory 46.

The error correcting circuit 42 stores data of a PO interleave into a register (not shown) and corrects errors in the stored data based on the error information from the error information generating circuit 41. The error-corrected data is then stored in the buffer memory 27.

The error information generating circuit 41 and the error correcting circuit 42 repeat the aforementioned process for all of the PO interleaves of a data block. Error information in the PO direction of the data block is stored in the memory 46.

Based on the position of erroneous data stored in the memory 46, the CRC arithmetic operation circuit 61 sequentially reads correction values in the PI direction, which correspond to the erroneous data position. The CRC arithmetic circuit 61 performs a CRC arithmetic operation using the read correction values and supplies the operation result (a second sample value) to the EOR circuit 45. That is, the CRC arithmetic operation circuit 61 generates the second sample value by performing the CRC arithmetic operation using correction values in the PI direction, which is the same as the order of data input. This method shortens the time between when error information is stored into the memory 46 and when the CRC arithmetic operation is completed.

The EOR circuit 45 receives the first determination data (a first sample value) stored in the memory 36 and the result of the CRC arithmetic operation (the second sample value) from the CRC arithmetic circuit 61 and performs an EOR operation. The result of the EOR operation is stored into the memory 47 as second determination data. The first determination data stored in the memory 36 represents the CRC arithmetic operation result of basic data that have been corrected by the PI error correcting circuit 30. The controller 25 determines whether PO error correction was accurately performed based on the second determination data.

Figure 17:
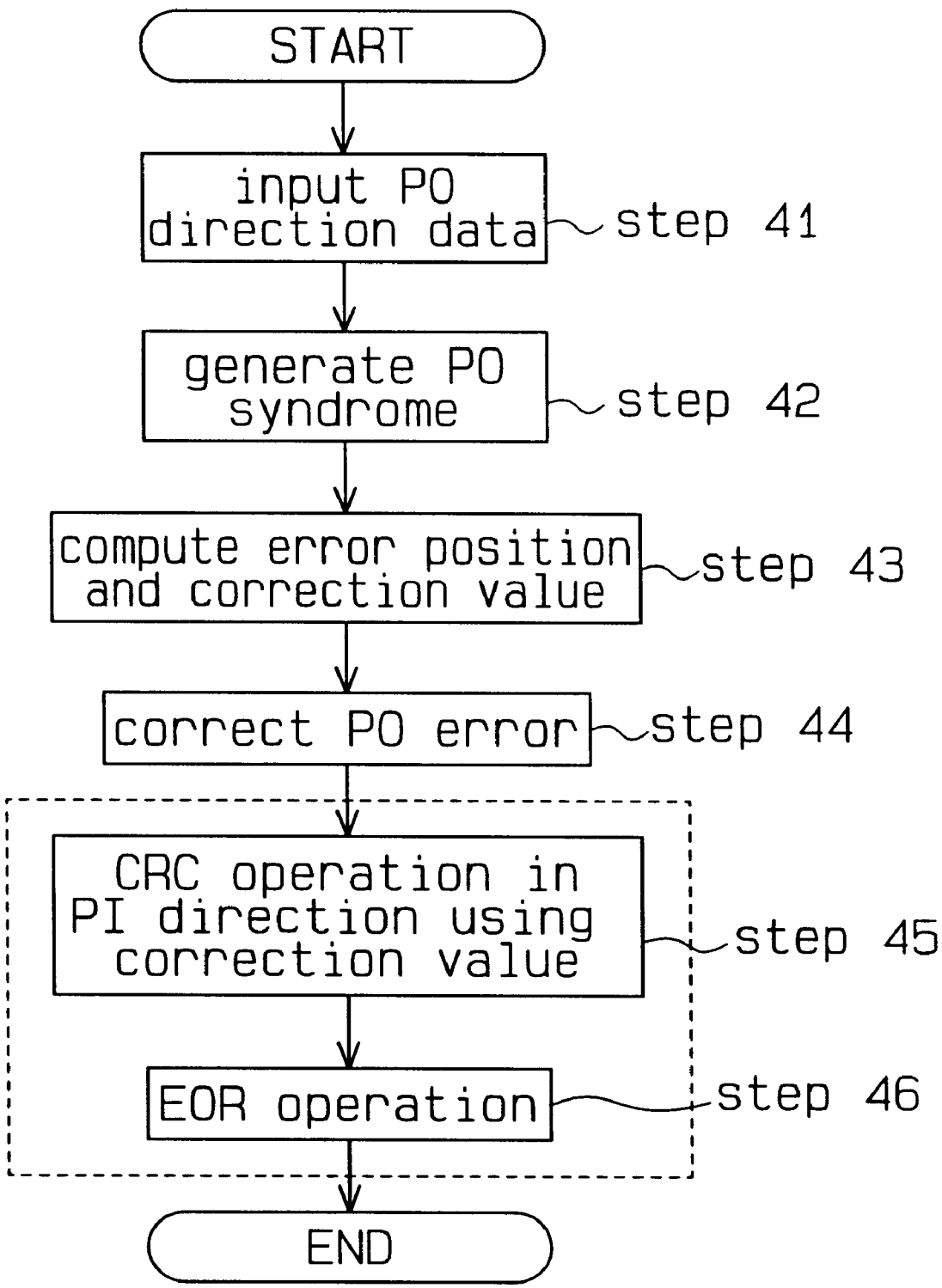
FIG. 17 is a flowchart showing a routine performed by the PO error correcting circuit of FIG. 16.

FIG. 17 is a flowchart showing substeps 41–47 of the PO error correction (step 3). In step 41, the controller 25 sequentially inputs interleaves in the PO direction in each sector 1 of a data block 2 a byte at a time. Next, in step 42, the controller 25 sequentially generates PO syndromes by a unit of a PO interleave.

At step 43, the controller 25 computes error information (the position of erroneous data and a correction value) of the PO interleave from the PO syndrome and stores the computed error information into the memory 46. At step 44, the controller 25 performs error correction on the PO interleave based on the error information and stores the error-corrected PO interleave into the buffer memory 27. PO correction for a data block 2 stored in the buffer memory 27 is completed when PO error correction is repeated for all of the PO interleaves of the data block 2. At this time, the memory 46 stores error information in the PO direction for the entire data block 2.

At step 45, the controller 25 reads correction values from the memory 46 along the PI direction and performs a CRC arithmetic operation using the correction values. In this manner, in the third embodiment, a CRC arithmetic operation using correction values is performed in the PI direction.

At step 46, the controller 25 performs an EOR operation on the CRC arithmetic operation result (step 45) that represents the result of a CRC check in the PI error correction and the CRC arithmetic operation result performed using a correction value (step 38). In this manner, the controller 25 obtains the result of a CRC check in the PO error correction.

Figure 18:
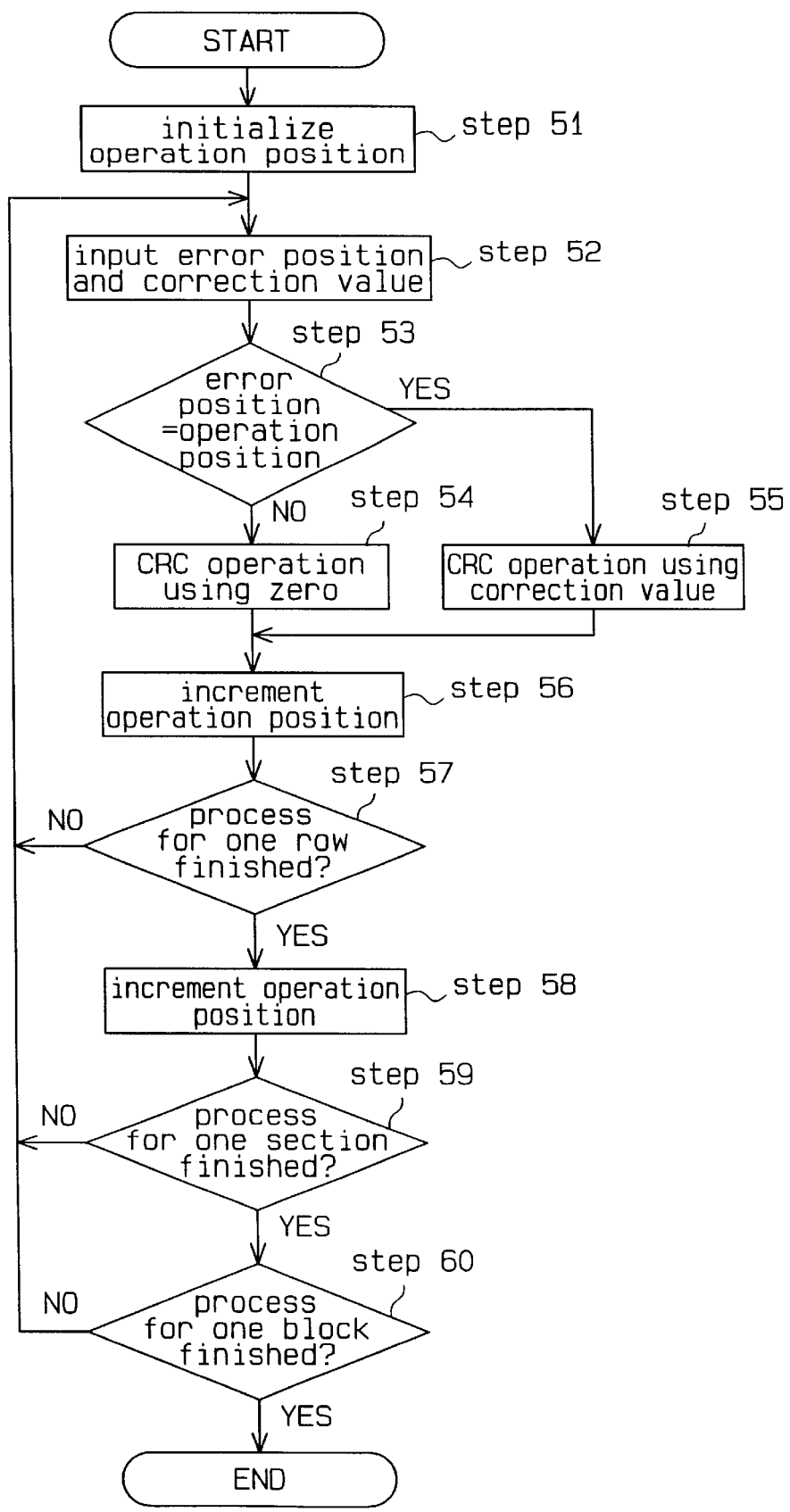
FIG. 18 is a flowchart showing a CRC arithmetic operation performed by the PO error correcting circuit of FIG. 16.

FIG. 18 is a flowchart showing substeps 51–57 of the CRC arithmetic operation (step 45) using a correction value.

At step 51, the controller 25 initializes an arithmetic operation position and a sector count, which correspond to the reading position of the basic data.

At step 52, the controller 25 inputs error position and correction value information from the memory 46 (generated in step 43). At step 53, the controller 25 determines whether the error position matches with the arithmetic operation location. If they do not match, the controller 25 determines that the basic data is correct and proceeds to step 54. At step 54, the controller 25 sets the correction value of the arithmetic operation position to zero and performs the CRC arithmetic operation using the correction value of zero and the previous CRC arithmetic operation result (step 54). Then, the controller 25 increments the arithmetic operation position and proceeds to step 56.

If the error position and the arithmetic operation position match with each other at step 53, the controller 25 determines that the basic data in the arithmetic operation position is incorrect and proceeds to step 55. At step 55, the controller 25 performs a CRC arithmetic operation using the correction value of the error position and the previous CRC arithmetic operation result. Thereafter, the controller 25 proceeds to step 56.

At step 56, the controller 25 increments the coordinate value X of the PI direction in the arithmetic operation position. At step 57, the controller 25 compares the coordinate value X with the number of data bytes in a row to determine whether the CRC arithmetic operation for the row is completed. If the operation for the row of data is not completed, the controller 25 returns to step 52. The controller 25 repeats steps 52–57 until it reaches the end of the row. In other words, the controller 25 performs a CRC arithmetic operation for each row, or in the PI direction, using a correction value that is included in the PO direction error information stored in the memory 46.

If the CRC arithmetic operation for data in one row is completed at step 57, the controller 25 proceeds to step 58. At step 58, the controller 25 increments the coordinate value Y of the PO direction in the arithmetic operation position.

At step 59, the controller 25 compares the coordinate value Y with the number of rows in a sector to determine whether the CRC arithmetic operation for one sector is completed. If the operation for one sector of data is not completed, the controller 25 returns to step 52. The controller 25 repeats steps 52–59 until the CRC arithmetic operation for one sector is completed. After completing the data processing of one sector, the controller 25 proceeds to step 60.

At step 60, the controller 25 compares the value of the sector count with the number of sectors in a block to determine whether the data processing for one block is completed. If the data processing for one block is not completed, the controller 25 again returns to step 52. After completing the data processing of one block, the controller 25 finishes CRC arithmetic operation.

It should be apparent to those skilled in the art that the present invention may be embodied in many other specific forms without departing from the spirit or scope of the invention. Particularly, it should be understood that the invention may be embodied in the following forms.

The present invention may be employed for error detection in which a Hamming code is used as the error detecting code (EDC).

Therefore, the present examples and embodiments are to be considered as illustrative and not restrictive and the invention is not to be limited to the details given herein, but may be modified within the scope and equivalence of the appended claims.

What is claimed is:

1. A method for error correcting two-dimensionally arranged data and for checking the correction using an error detecting code affixed to the data, wherein the error detecting code was obtained by performing a checking arithmetic operation on the data in a first direction, the method comprising:

performing a first checking arithmetic operation on the data using the error detecting code to generate a first sample value;

error correcting the data in the first direction and generating a first correction value if an error is detected;

performing a second checking arithmetic operation in the first direction using the first correction value to generate a second sample value;

comparing the first sample value with the second sample value to generate a first check value;

error correcting the data in a second direction and generating a second correction value if an error is detected;

performing a third checking arithmetic operation in the first direction using the second correction value to generate a third sample value; and comparing the first check value with the third sample value to generate a second check value which represents the check result of the error correction along the second direction.

2. The method according to claim 1, wherein at least one of comparing the first sample value and comparing the first check value further comprises comparing the associated values by performing an exclusive OR operation.

3. The method according to claim 1, wherein generating the third sample value further comprises:

sorting the second correction value into the first direction; and performing the third checking arithmetic operation using the sorted second correction value to generate the third sample value.

4. The method according to claim 1, wherein generating the third sample value further comprises:

sequentially obtaining the second correction value in the first direction; and performing the third checking arithmetic operation using the sequentially obtained second correction value to generate the third sample value.

5. The method according to claim 1, wherein performing the second checking arithmetic operation further comprises:

performing the second checking arithmetic operation using zero for data having no errors that correspond to positions excluding an error position; and performing the second checking arithmetic operation using an associated correction value for data having an error that corresponds to the error position.

6. The method according to claim 1, wherein performing the third checking arithmetic operations further comprises:

performing the third checking arithmetic operation using zero for data having no errors that correspond to positions excluding an error position; and performing the third checking arithmetic operation using an associated correction value for data having an error that corresponds to the error position.

7. A method for error correcting two-dimensionally arranged data and for checking the correction using an error detecting code affixed to the data, wherein the error correcting code is obtained by performing a checking arithmetic operation on the data along a first direction, the method comprising:

performing a first checking arithmetic operation on the data using the error detecting code to generate a first sample value;

performing an error correction operation on the data in a second direction and generating a correction value if an error was detected;

performing a second checking arithmetic operation along the first direction using the correction value to generate a second sample value; and comparing the first sample value with the second sample value to generate a check value which represents the check result of the error correction in the second direction.

8. The method according to claim 7, wherein comparing the first sample value further comprises comparing the first sample value with the second sample value by performing an exclusive OR operation.

9. The method according to claim 7, wherein generating the second sample value further comprises:

sorting the correction value into the first direction; and performing the second checking arithmetic operation using the sorted correction value to generate the second sample value.

10. The method according to claim 7, wherein generating the second sample value further comprises:

sequentially obtaining the correction value along the first direction; and performing the checking arithmetic operation using the sequentially obtained correction value to generate the second sample value.

11. The method according to claim 7, wherein performing the second checking arithmetic operation further comprises:

performing the checking arithmetic operation using zero for data having no errors that correspond to positions excluding an error position; and performing the checking arithmetic operation using an associated correction value for data having an error that corresponds to the error position.

12. The method according to claim 7, wherein the data has previously been error-corrected in the first direction.

13. A method for checking a result of error correction performed on two-dimensionally arranged data, wherein a first error correcting code for the error correction is affixed to the data in a first direction and an error detecting code, previously obtained by performing an operation along a second direction using the data, is affixed to the data, the method comprising:

computing an error position along the first direction and a correction value using the data and the first error correcting code;

correcting an error in the data in the first direction using the computed error position and the correction value;

performing a checking operation along the second direction using the data and a second error correcting code; and performing a checking arithmetic operation along the second direction using the correction value based on the error position to generate a check value.

14. The method according to claim 13, wherein performing the checking arithmetic operation further comprises:

sorting the correction value in the first direction into a correction value in the second direction based on the error position along the first direction; and performing the checking arithmetic operation using the sorted correction value along the second direction to generate the check value.

15. The method according to claim 13, wherein performing the checking arithmetic operation further comprises:
temporarily storing the correction value into a memory;
reading the memory in the second direction to sequentially obtain a correction value in the second direction; and
performing the checking arithmetic operation using the obtained correction value in the second direction to obtain the check value.

16. A method for checking a result of an error correction operation performed on two-dimensionally arranged data, wherein a row error correcting code is affixed to the data in the row direction, a column error correcting code is affixed to the data in the column direction, and an error detecting code is affixed to the data, wherein the error detecting code was previously obtained by performing an operation along the row direction using the data, the method comprising:
computing an error position along the row direction and a first correction value of the data using the data and the row error correcting code;
correcting an error in the data of the row direction using the computed error position and the first correction value;
performing a first checking operation using the data and the error detecting code and performing a first checking arithmetic operation using the first correction value to generate a first check value based on the two first operation results;
computing an error position along the column direction and a second correction value using the data and the column error correcting code;
correcting an error in the data in the column direction using the error position along the column direction and the second correction value;
performing a second checking operation using the data and the error detecting code and performing a second checking arithmetic operation along the row direction using the second correction value based on the error position to obtain an arithmetic operation result; and
comparing the arithmetic operation result with the first check value to generate a second check value that represents the result of the error correction in the column direction.

17. The method according to claim 16, wherein performing the checking arithmetic operation along the row direction further comprises:
sorting the second correction value into a correction value of the row direction based on the error position in the column direction; and
performing the predetermined checking arithmetic operation using the sorted correction value of the row direction to obtain the arithmetic operation result.

18. The method according to claim 16, wherein performing the checking arithmetic operation along the row direction further comprises:
temporarily storing the second correction value in a memory;
reading the memory along the row direction to sequentially obtain a correction value of the column direction as a correction value in the row direction; and
performing the predetermined checking arithmetic operation using the obtained correction value of the row direction to obtain the arithmetic operation result.

19. An apparatus for error correcting two-dimensionally arranged data and for checking the correction using an error detecting code affixed to the data, wherein the error detecting code was previously obtained by performing a checking arithmetic operation on the data along a first direction, the apparatus comprising:
a first checking arithmetic operation circuit for performing a checking arithmetic operation on the data using the error detecting code to generate a first sample value;
a first error correcting circuit for error correcting the data along the first direction and for generating a first correction value if there is an error;
a second checking arithmetic operation circuit for performing a checking arithmetic operation along the first direction using the first correction value to generate a second sample value;
a first comparator for comparing the first sample value with the second sample value to generate a first check value;
a second error correcting circuit for error correcting the error-corrected data along a second direction and for generating a second correction value if there is an error;
a third checking arithmetic operation circuit for performing a checking arithmetic operation along the first direction using the second correction value to generate a third sample value; and
a second comparator for comparing the first check value with the third sample value to generate a second check value, which represents the check result of the error correction along the second direction.

20. The apparatus according to claim 19, wherein at least one of the first and second comparators compares the associated values by performing an exclusive OR operation.

21. The apparatus according to claim 19, further comprising a memory connected to the second error correcting circuit for temporarily storing the second correction value, and wherein the third checking arithmetic operation circuit includes a sorter for sorting the second correction value stored in the memory into the first direction and a checking circuit for performing the checking arithmetic operation using the sorted second correction value to generate the third sample value.

22. The apparatus according to claim 19, further comprising a memory connected to the second error correcting circuit for temporarily storing the second correction value, and wherein the third checking arithmetic operation circuit sequentially obtains the second correction value from the memory along the first direction and performs the checking arithmetic operation using the sequentially obtained second correction value to generate the third sample value.

23. The apparatus according to claim 19, wherein the second and third checking arithmetic operation circuits perform the checking arithmetic operation using zero for data having no errors that correspond to positions excluding an error position, and perform the checking arithmetic operation using an associated correction value for data that has an error that corresponds to the error position.

24. An apparatus for error correcting two-dimensionally arranged data and for checking the correction using an error detecting code affixed to the data, wherein the error detecting code was previously obtained by performing a checking arithmetic operation on the data along a first direction, the apparatus comprising:
a first checking arithmetic operation circuit for performing a checking arithmetic operation on the data using the error detecting code to generate a first sample value;

an error correcting circuit for error correcting the data along a second direction and for generating a first correction value if an error is detected;

a second checking arithmetic operation circuit for performing a checking arithmetic operation along the first direction using the first correction value to generate a second sample value; and a comparator for comparing the first sample value with the second sample value to generate a check value that represents the check result of the error correction along the second direction.

25. The apparatus according to claim 24, wherein the comparator compares the first sample value with the second sample value by performing an exclusive OR operation.

26. The apparatus according to claim 24, further comprising a memory connected to the error correcting circuit for temporarily storing the correction value, and wherein the second checking arithmetic operation circuit includes a sorter for sorting the correction value stored in the memory into the first direction and a checking arithmetic operation circuit for performing the checking arithmetic operation using the sorted correction value to generate a third sample value.

27. The apparatus according to claim 24, further comprising a memory connected to the error correcting circuit for temporarily storing the first correction value, and wherein the second checking arithmetic operation circuit sequentially obtains the first correction value from the memory along the first direction and performs its checking arithmetic operation using the obtained correction value to generate the second sample value.

28. The apparatus according to claim 24, wherein the second checking arithmetic operation circuit performs the checking arithmetic operation using zero for data having no errors that correspond to positions excluding an error position, and performs the checking arithmetic operation using an associated correction value for data that has an error that corresponds to the error position.

29. An apparatus for checking the result of error correction on two-dimensionally arranged data, wherein a first error correcting code for the error correction is affixed to the data in a first direction and an error detecting code, which was previously obtained by performing an operation along a second direction of the data, is affixed to the data, the apparatus comprising:

a first circuit for computing an error position in the first direction and a correction value of the data using the data and the first error correcting code and for correcting an error in the data along the first direction using the error position in the first direction and the correction value; and a second circuit for performing a checking operation along the second direction using the data and the error correcting code and for performing a check arithmetic operation using the correction value based on the error position to generate a check value.

30. The apparatus according to claim 29, further comprising a memory connected to the first circuit for temporarily storing the error position and the correction value, and wherein the first circuit includes a sorter for sorting the correction value stored in the memory into a correction value in the second direction and a checking arithmetic operation circuit for performing the checking arithmetic operation using the sorted correction value to gene value.

31. The apparatus according to claim 29, further comprising a memory connected to the first circuit for temporarily storing the correction value, and wherein the second circuit performs a memory reading operation along the second direction to sequentially obtain the correction value as a correction value along the second direction and then performs the checking arithmetic operation using the sequentially obtained correction value to generate the check value.

32. An apparatus for checking the result of error correction on two-dimensionally arranged data, wherein a row error correcting code for the error correction is affixed to the data in the row direction and a column error correcting code is affixed to the data in the column direction, and wherein an error detecting code previously obtained by performing an operation along the row direction is affixed to the data, the apparatus comprising:

a row error correcting circuit for correcting an error in the row direction using the data and the row error correcting code, the row error correcting circuit including a first circuit for computing an error position in the row direction and a first correction value of the data using the data and the row error correcting code;

a second circuit for correcting an error in the data in the row direction using the computed error position and the first correction value; and a first checking arithmetic operation circuit for performing a first checking operation using the data and the error detecting code and for performing a first checking arithmetic operation using the first correction value along the row direction to generate a first check value; and a column error correcting circuit for correcting an error in the column direction using the data and the column error correcting code, the column error correcting circuit including a third circuit for computing an error position in the column direction and a second correction value using the data and the column error correcting code;

a fourth circuit for correcting an error in the data in the column direction using the error position in the column direction and the second correction value;

a second checking arithmetic operation circuit for performing a second checking operating along the second direction using the data and the error detecting code and for performing a second checking arithmetic operation along the row direction using the second correction value based on the error position to generate an arithmetic operation result; and a circuit for comparing the arithmetic operation result with the first check value to generate a second check value that represents the result of the error correction in the column direction.

33. The apparatus according to claim 32, further comprising a memory connected to the column error correcting circuit for temporarily storing the error position in the column direction and the second correction value, and wherein the second checking arithmetic operation circuit includes a sorter for sorting the second correction value stored in the memory into a correction value in the row direction and a checking arithmetic operation circuit for performing the predetermined checking arithmetic operation using the sorted correction value to generate the arithmetic operation result.

34. The apparatus according to claim 32, further comprising a memory connected to the second error correcting circuit for temporarily storing the second correction value, and wherein the second checking arithmetic operation circuit performs a memory reading operation along the row direction to sequentially obtain the second correction value as a correction value along the row direction and performs the predetermined checking arithmetic operation using the obtained correction value to generate the arithmetic operation result.

35. A method for checking a result of an error correction operation performed on two-dimensionally arranged data, wherein a second error correcting code is affixed to the data in the second direction, a first error correcting code is affixed to the data in the first direction, and an error detecting code is affixed to the data, wherein the error detecting code was previously obtained by performing an operation along the second direction using the data, the method comprising:

computing an error position along the second direction and a first correction value of the data using the data and the second error correcting code;

correcting an error in the data of the second direction using the computed error position and the first correction value;

performing a first checking operation using the data and the error detecting code and performing a first checking arithmetic operation using the first correction value to generate a first check value based on the two first operation results;

computing an error position along the first direction and a second correction value using the data and the first error correcting code;

correcting an error in the data in the first direction using the error position along the first direction and the second correction value;

performing a second checking operation using the data and the error detecting code and performing a second checking arithmetic operation along the second direction using the second correction value based on the error position to obtain an arithmetic operation result; and comparing the arithmetic operation result with the first check value to generate a second check value that represents the result of the error correction in the first direction.

36. An apparatus for checking the result of error correction on two-dimensionally arranged data, wherein a second error correcting code for the error correction is affixed to the data in the second direction and a first error correcting code is affixed to the data in the first direction, and wherein an error detecting code previously obtained by performing an operation along the second direction is affixed to the data, the apparatus comprising:

a second error correcting circuit for correcting an error in the second direction using the data and the second error correcting code, the second error correcting circuit including
a first circuit for computing an error position in the second direction and a first correction value of the data using the data and the second error correcting code;
a second circuit for correcting an error in the detain the second direction using the computed error position and the first correction value; and
a first checking arithmetic operation circuit for performing a first checking operation using the data and the error detecting code and for performing a first checking arithmetic operation using the first correction value along the second direction to generate a first check value; and a first error correcting circuit for correcting an error in the first direction using the data and the first error correcting code, the first error correcting circuit including
a third circuit for computing an error position in the first direction and a second correction value using the data and the first error correcting code;
a fourth circuit for correcting an error in the data in the first direction using the error position in the first direction and the second correction value;
a second checking arithmetic operation circuit for performing a second checking operation along the second direction using the data and the error correcting code and for performing a second checking arithmetic operation using the second correction value based on the error position to generate an arithmetic operation result; and
a circuit for comparing the arithmetic operation result with the first check value to generate a second check value that represents the result of the error correction in the first direction.

* * * * *